United States Patent
Liu et al.

(10) Patent No.: US 9,509,295 B1
(45) Date of Patent: Nov. 29, 2016

(54) SPREAD-SPECTRUM CLOCK GENERATOR

(71) Applicant: FREESCALE SEMICONDUCTOR, INC., Austin, TX (US)

(72) Inventors: Meng Liu, Tianjin (CN); Bin Feng, Tianjin (CN); Liang Qiu, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/992,007

(22) Filed: Jan. 10, 2016

(30) Foreign Application Priority Data

Jul. 22, 2015 (CN) .......................... 2015 1 0605395

(51) Int. Cl.
*H03K 5/135* (2006.01)
*H03K 3/84* (2006.01)

(52) U.S. Cl.
CPC ................. *H03K 5/135* (2013.01); *H03K 3/84* (2013.01)

(58) Field of Classification Search
CPC ................................. H03K 3/84; H03K 5/135
USPC ................ 327/105, 141, 156, 159, 237, 241
See application file for complete search history.

(56) References Cited

U.S. PATENT DOCUMENTS

| | | |
|---|---|---|
| 7,084,860 B1 | 8/2006 | Jaeger |
| 7,541,853 B2 | 6/2009 | Nakadaira |
| 7,760,839 B2 | 7/2010 | Wu |
| 7,944,319 B2 | 5/2011 | Kerr |
| 8,320,428 B1 | 11/2012 | Hattori |
| 8,565,284 B2 | 10/2013 | Ta |
| 2004/0095988 A1 | 5/2004 | Kim |
| 2008/0111714 A1 | 5/2008 | Kremin |
| 2008/0246870 A1* | 10/2008 | Shimono .................. H03K 3/84 348/311 |
| 2010/0051354 A1 | 3/2010 | Ningrat |

* cited by examiner

*Primary Examiner* — John Poos
(74) *Attorney, Agent, or Firm* — Charles E. Bergere

(57) ABSTRACT

A spread-spectrum clock (SSC) generator for generating an SSC signal. The SSC generator has a first up/down counter that operates for a fixed, first duration (t1), a first PRBS generator that operate for a variable, second duration (t2), a second up/down counter that operates for a fixed, third duration (t3), and a second PRBS generator that operates for a variable, fourth duration (t4). A state machine sequentially triggers the first counter and the first PRBS generator to generate a positive portion of a cycle of the SSC signal and then sequentially triggers the second counter and the second PRBS generator to generate a negative portion of the cycle of the SSC signal. For a set of parameters stored in configurable registers, the first and third durations are fixed from cycle to cycle, while the second and fourth durations vary from cycle to cycle.

9 Claims, 3 Drawing Sheets

SPREAD-SPECTRUM CLOCK GENERATOR

BACKGROUND

The present invention relates generally to integrated circuits and, more particularly, to integrated circuits incorporating a spread-spectrum clock (SSC) generator.

An SSC generator modulates, or dithers, the frequency of its generated output SSC signal over a range of frequencies to lower the peak energy contained in the output SSC signal and, concomitantly, lower the clock-generated electromagnetic interference from both the fundamental clock frequency and harmonic frequencies.

In some SSC generators, a controllable delay circuit is used to delay an input clock signal. A control unit performs statistical analyses of the output SSC signal relative to the timing of the input clock signal and generates a control signal that is provided to the controllable delay circuit to vary the delay applied to the input clock signal. These SSC generators can have a relatively high signal-to-noise ratio (SNR) and relatively slow convergence. Accordingly, it would be advantageous to have an SSC generator that can be operated with lower SNR and faster convergence.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION OF PREFERRED EMBODIMENTS

Detailed illustrative embodiments of the present invention are disclosed herein. However, specific structural and functional details disclosed herein are representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

One embodiment of the invention is a spread-spectrum clock (SSC) generator for generating an SSC signal. A first counter is configurable to operate for a first duration (t1) corresponding to a fixed part of a positive portion of an SSC cycle of the SSC signal. A first random generator is configurable to operate for a second duration (t2) corresponding to a variable part of the positive portion of the SSC cycle. A second counter is configurable to operate for a third duration (t3) corresponding to a fixed part of a negative portion of the SSC cycle. A second random generator is configurable to operate for a fourth duration (t4) corresponding to a variable part of the negative portion of the SSC cycle. A set of configurable registers is configurable to store parameters to control operations of the first and second counters and the first and second random generators. A state machine is configured to sequentially trigger the first and second counters and the first and second random generators in a specified order to generate the SSC cycle.

Figure 1:
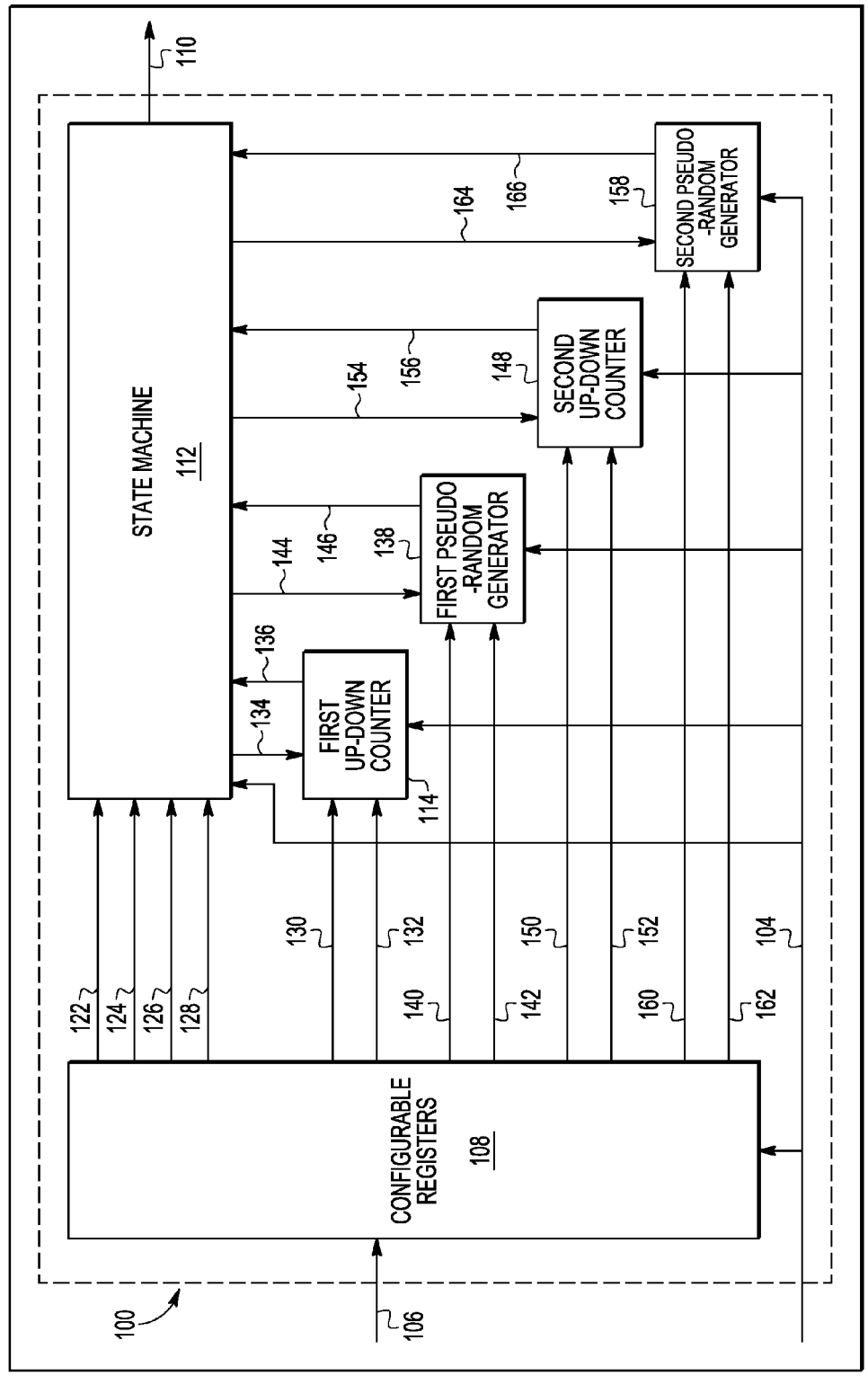
FIG. 1 is a schematic block diagram of a spread-spectrum clock (SSC) generator according to one embodiment of the invention.

FIG. 1 is a schematic block diagram of an SSC generator 100 according to one embodiment of the invention. The SSC generator 100 is fabricated as part of an integrated circuit 102 and is clocked by a relatively high-speed input clock signal 104. Configurable registers 108 store control parameters received over a bus 106 from a control central processing unit or other master processor (not shown) for quick access by and use in the SSC generator 100. The SSC generator 100 produces an output SSC signal 110 having an average frequency $f_{SSC}$ that is a fraction of the frequency $f_{IN}$ of the input clock signal 104.

A state machine 112 receives, from the registers 108, a one-bit first-counter select signal 122, a one-bit first-generator select signal 124, a one-bit second-counter select signal 126, and a one-bit second-generator select signal 128.

A first (e.g., up/down) counter 114 receives (i) a multi-bit first-counter minimum value 130 and a multi-bit first-counter maximum value 132 from the configurable registers 108 and (ii) a one-bit first-counter start signal 134 from the state machine 112. When the first-counter start signal 134 is asserted, the first counter 114 initializes an internal counter (not shown) to the first-counter minimum value 130 and increments the internal counter once for each cycle of the input clock signal 104 (e.g., at every rising edge). When the internal counter reaches the first-counter maximum value 132, the first up-down counter 114 asserts a one-bit first-counter done signal 136 to the state machine 112 to inform the state machine 112 that the first counter 114 has completed its counting.

A first pseudo-random binary sequence (PRBS) generator 138 receives (i) a set of first-generator polynomial coefficients 140 and a first-generator initial PRBS value 142 from the registers 108 and (ii) a first-generator start signal 144 from the state machine 112. The first PRBS generator 138 generates a new bit of a pseudo-random binary sequence at every cycle of the input clock signal 104 and provides a first-generator done signal 146 to the state machine 112 when a positive or negative edge is generated to inform the state machine 112 that the first PRBS generator 138 has completed its operation.

A second (e.g., up/down) counter 148 operates analogously to the first counter 114 based on (i) a multi-bit second-counter minimum value 150 and a multi-bit second-counter maximum value 152 received from the configurable registers 108 and (ii) a one-bit second-counter start signal 154 received from the state machine 112 to generate a one-bit second-counter done signal 156 to inform the state machine 112 that the second counter 148 has completed its counting.

Similarly, a second PRBS generator 158 operates analogously to the first PRBS generator 138 based on (i) a set of second-generator polynomial coefficients 160 and a second-generator initial PRBS value 162 received from the registers 108 and (ii) a second-generator start signal 164 received from the state machine 112 to generate a second-generator done signal 166 to inform the state machine 112 that the second PRBS generator 158 has completed its operation.

In one possible implementation, the first and second PRBS generators 138 and 158 implement the same PRBS polynomial, albeit with potentially different initial PRBS values. The PRBS polynomial may be implemented as a conventional linear feedback shift register (LSFR), whose input is a linear function of its previous output. The sequence of binary values produced by an LSFR is determined by its current, or previous, state. The sequence of possible states is finite, after which the sequence repeats. Implementation of LSFRs with higher-order primitive polynomials will produce a longer sequence of bits before repeating.

Figure 2:
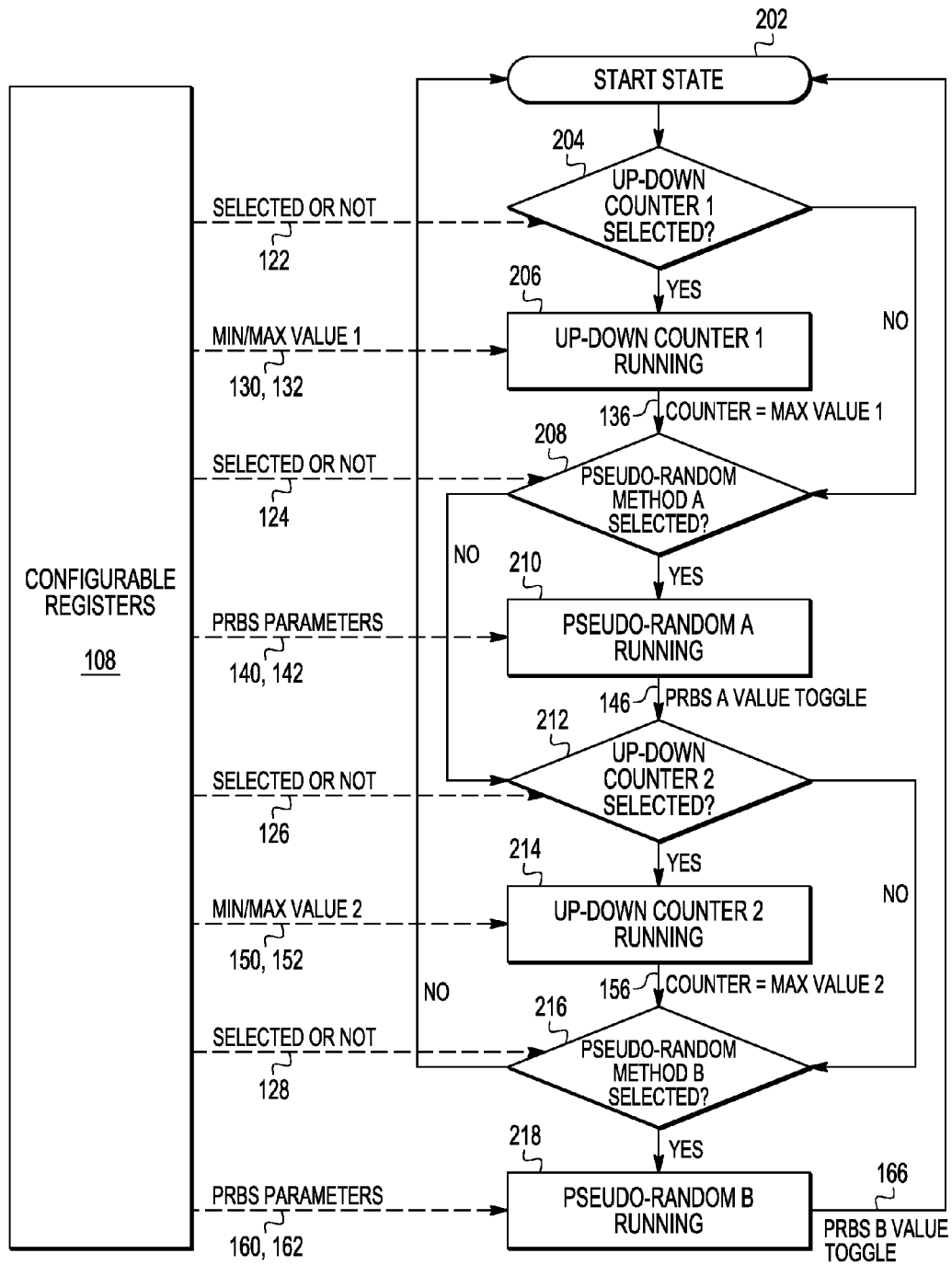
FIG. 2 is a flow chart for the state machine of FIG. 1.

FIG. 2 is a flow diagram for the state machine 112 of FIG. 1 according to an embodiment of the invention. In general, the state machine 112 sequentially triggers first the first counter 114, then the first PRBS generator 138, then the second counter 148, and then the second PRBS generator 158 to generate one cycle of the SSC signal 110. The sum of the number of cycles of the input clock signal 104 that it takes for the first counter 114 (t1) and then the first PRBS generator 138 (t2) to finish their operations determines the duration (t1+t2) of the positive portion of the current SCC signal 110 cycle, while the sum of the number of cycles of the input clock signal 104 that it takes for the second counter 148 (t3) and then the second PRBS generator 158 (t4) to finish their operations determines the duration (t3+t4) of the negative portion of the current SCC signal 110 cycle. When the second PRBS generator 158 finishes its processing, the sequence is repeated starting at the next rising edge in the input clock signal 104 to generate the next cycle of the SSC signal 110.

For a given set of values stored in the configurable registers 108, the durations t1 and t3 associated with the first and second counters 114 and 148, respectively, will be fixed (and potentially different from one another), while the durations t2 and t4 associated with the first and second PRBS generators 138 and 158, respectively, will vary from SSC cycle to SSC cycle. The average frequency $f_{SSC}$ of the SSC signal 110 is given according to Equation (1) as follows:

$$f_{SSC} = f_{IN}/(t1 + t2_{ave} + t3 + t4_{ave}) \quad (1)$$

where $t2_{ave}$ and $t4_{ave}$ are the average durations of the operations of the first and second PRBS generators 138 and 158, respectively.

Note that the four select signals 122-128 enable the two counters 114 and 148 and the two PRBS generators 138 and 158 to be independently disabled to provide a relatively high degree of programmability to the SSC generator 100. For typical SSC generation, such as the one described below, all four counters/generators will be selected.

After the SSC generator 100 is turned on, the processing of FIG. 2 begins at step 202 at the next rising edge of the input clock signal 104, at which time the state machine 112 drives the SSC signal 110 high.

At step 204, if the first counter 114 is selected (i.e., the select signal 122 is asserted), then, at step 206, the state machine 112 asserts the first-counter start signal 134, and the first counter 114 initializes its internal counter to the first-counter minimum value 130 and increments the internal counter once for each cycle of the input clock signal 104. When the internal counter reaches the first-counter maximum value 132, the first counter 114 asserts the first-counter done signal 136.

At step 208, at the next rising edge in the input clock signal 104, if the first PRBS generator 138 is selected (i.e., the select signal 124 is asserted), then, at step 210, the state machine 112 asserts the first-generator start signal 144, and the first PRBS generator 138 initializes its internal registers based on the parameters 140 and 142 and generates a new PRBS value at each cycle of the input clock signal 104. When the first PRBS generator 138 determines that its processing is completed, the first PRBS generator 138 asserts the first-generator done signal 146. Note that the first-generator initial PRBS value 142 is applied to the first PRBS generator 138 only for the first cycle of the SCC signal 110. For each subsequent cycle, the first PRBS generator 138 retains its value from the previous cycle.

At the next rising edge of the input clock signal 104, the state machine 112 drives the SSC signal 110 low, and processing proceeds to step 212. The processing of steps 212-214 for the second counter 148 is analogous to the processing of steps 204-206 for the first counter 114. Similarly, the processing of steps 216-218 for the second PRBS generator 158 is analogous to the processing of steps 208-210 for the first PRBS generator 138.

After the processing of the second PRBS generator 158 is completed, processing then returns to step 202 to generate the next cycle of the SSC signal 110. This processing will continue until the SSC generator 100 is turn off. Note that any one or more values stored the configurable registers 108 may be updated as desired.

Figure 3:
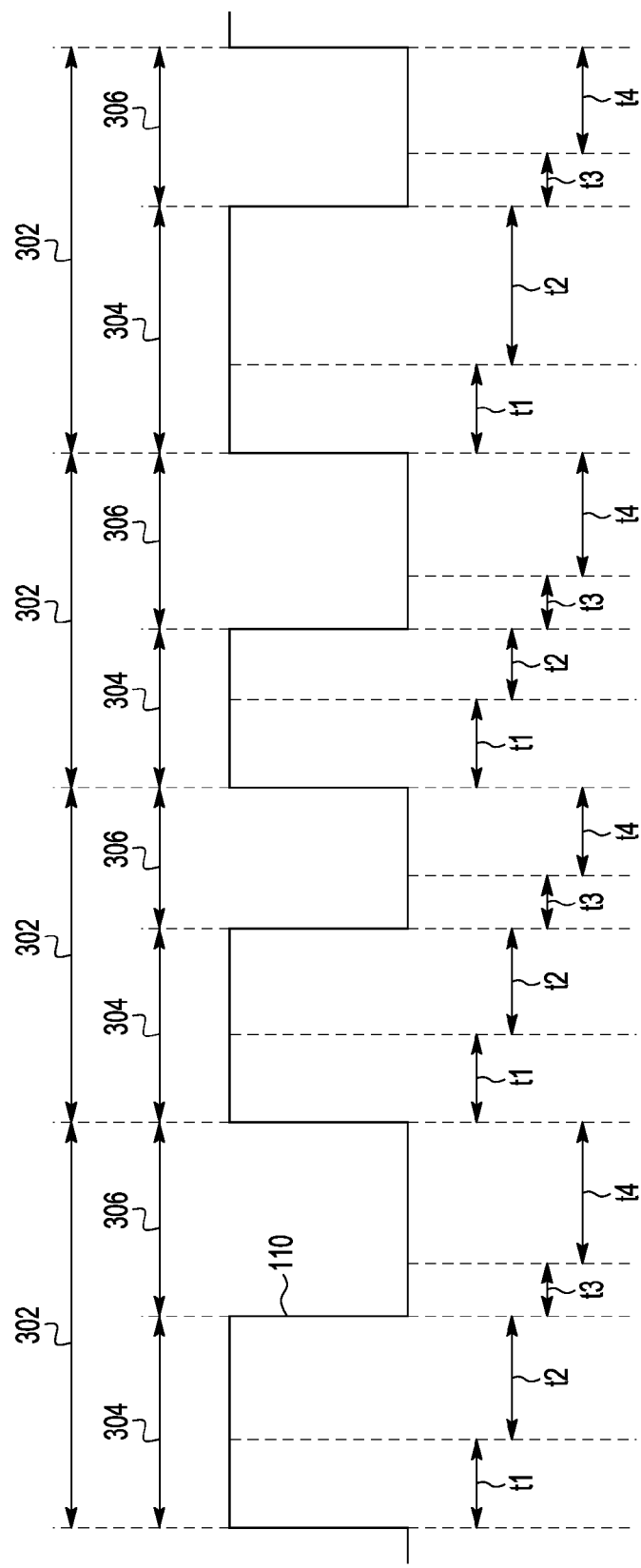
FIG. 3 is a graphical illustration of an SSC signal generated by the SSC generator of FIG. 1.

FIG. 3 is a graphical illustration of an SSC signal 110 generated by the SSC generator 100 of FIG. 1 according to an embodiment of the invention. Each cycle 302 of the SSC signal 100 includes four time segments t1, t2, t3, and t4. Time segments t1 and t2 form the positive portion 304 of each cycle 302, while time segments t3 and t4 form the negative portion 306 of each cycle 302. As shown in FIG. 3, the time segments t1 are the same from cycle to cycle as generated by the first counter 114, and the time segments t3 are also the same from cycle to cycle as generated by the second counter 148, while the time segments t2 and t4 vary from cycle to cycle as generated by the PRBS generators 138 and 158, respectively.

Because of its higher degree of programmability, the SSC generator 100 of FIG. 1 can be operated with lower SNR and faster convergence than conventional SSC generators.

Although the invention has been described in the context of the first and second counters 114 and 148 always counting up from the minimum values to their maximum values, when the counters are up/down counters, they can be implemented to alternate between counting up (from minimum value to maximum value) and counting down (from maximum value to minimum value) for consecutive cycles of the SSC clock 110.

Although the invention has been described in the context of the SSC generator 100, which sequentially triggers the first counter 114 followed by the first PRBS generator 138 followed by the second counter 148 followed by the second PRBS generator 158, in other implementations, the first PRBS generator 138 can be triggered before the first counter 114 to generate the random part (t2) of the high portion of the SSC signal 110 before the fixed part (t1) and/or the second PRBS generator 158 can be triggered before the second counter 148 to generate the random part (t4) of the low portion of the SSC signal 110 before the fixed part (t3).

Furthermore, although the invention has been described in the context of the SSC generator 100, which generates the positive portion (t1+t2) of the SSC signal 110 before the negative portion (t3+t4), in other implementations, the negative portion can be generated before the positive portion. In still other implementations, the fixed part (t1) or the variable part (t2) of the positive portion could be generated first, followed by the fixed and variable parts (t3+t4) of the negative portion in either order, followed by the other part of the positive portion (t2 or t1). In yet other implementations, the fixed part (t3) or the variable part (t4) of the negative portion could be generated first, followed by the fixed and variable parts (t1+t2) of the positive portion in either order, followed by the other part of the negative portion (t4 or t3).

In general, as long as (i) the fixed and variable parts (t1 and t2) of the positive portion are generated consecutively and (ii) the fixed and variable parts (t3 and t4) of the negative portion are generated consecutively when viewed over consecutive cycles of the SSC signal, it does not matter in what order the different parts are generated within each processing cycle of the state machine.

In view of the foregoing, unless explicitly recited otherwise, it will be understood that, as referred to in the claims, (i) the first counter can be triggered before or after the second counter, (ii) the first random generator can be triggered before or after the second random generator, and (iii) the first, second, third, and fourth durations t1-t4 can be generated in any suitable order.

While the exemplary embodiments of the invention have been described with respect to processes of circuits, including possible implementation as a single integrated circuit, a multi-chip module, a single card, or a multi-card circuit pack, the invention is not so limited. As would be apparent to one skilled in the art, various functions of circuit elements may also be implemented as processing blocks in a software program. Such software may be employed in, for example, a digital signal processor, micro-controller, general purpose computer, or other processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes, ports, or paths may be referred to by the same name and are interchangeable for purposes here.

Embodiments of the invention can be manifest in the form of methods and apparatuses for practicing those methods. Embodiments of the invention can also be manifest in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. Embodiments of the invention can also be manifest in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits Any suitable processor-usable/readable or computer-usable/readable storage medium may be utilized. The storage medium may be (without limitation) an electronic, magnetic, optical, electromagnetic, infrared, or semiconductor system, apparatus, or device. A more-specific, non-exhaustive list of possible storage media include a magnetic tape, a portable computer diskette, a hard disk, a random access memory (RAM), a read-only memory (ROM), an erasable programmable read-only memory (EPROM) or Flash memory, a portable compact disc read-only memory (CD-ROM), an optical storage device, and a magnetic storage device. Note that the storage medium could even be paper or another suitable medium upon which the program is printed, since the program can be electronically captured via, for instance, optical scanning of the printing, then compiled, interpreted, or otherwise processed in a suitable manner including but not limited to optical character recognition, if necessary, and then stored in a processor or computer memory. In the context of this disclosure, a suitable storage medium may be any medium that can contain or store a program for use by or in connection with an instruction execution system, apparatus, or device.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A spread-spectrum clock (SSC) generator for generating an SSC signal, the SSC generator comprising:
    a first counter that operates for a first duration (t1) corresponding to a fixed part of a positive portion of an SSC cycle of the SSC signal;
    a first random generator that operates for a second duration (t2) corresponding to a variable part of the positive portion of the SSC cycle;
    a second counter that operates for a third duration (t3) corresponding to a fixed part of a negative portion of the SSC cycle;
    a second random generator that operates for a fourth duration (t4) corresponding to a variable part of the negative portion of the SSC cycle;
    a set of configurable registers that store parameters to control operations of the first and second counters and the first and second random generators; and
    a state machine that sequentially triggers the first and second counters and the first and second random generators in a specified order to generate the SSC cycle,
    wherein each counter is an up-down counter.

2. The SSC generator of claim 1, wherein the specified order is t1, then t2, then t3, then t4.

3. The SSC generator of claim 1, wherein each random generator is a pseudo-random binary sequence (PRBS) generator.

4. The SSC generator of claim 1, wherein, for a set of parameters stored in the registers:
    the first duration is fixed from cycle to cycle of the SSC signal;
    the third duration is fixed from cycle to cycle of the SSC signal; and
    the second and fourth durations vary from cycle to cycle of the SSC signal.

5. The SSC generator of claim 1, wherein each counter and each random generator are configurable to be independently selected or disabled.

6. The SSC generator of claim 1, wherein:
    each random generator is a PRBS generator;
    for a set of parameters stored in the registers:
        the first duration is fixed from cycle to cycle of the SSC signal;
        the third duration is fixed from cycle to cycle of the SSC signal; and
        the second and fourth durations vary from cycle to cycle of the SSC signal; and
    each counter and each random generator are configurable to be independently selected or disabled.

7. The SSC generator of claim 6, wherein the specified order is t8, then t2, then t3, then t4.

8. A spread-spectrum clock (SSC) generator for generating an SSC signal, the SSC generator comprising:
    a first counter that operates for a first duration (t1) corresponding to a fixed part of a positive portion of an SSC cycle of the SSC signal;
    a first random generator that operates for a second duration (t2) corresponding to a variable part of the positive portion of the SSC cycle;
    a second counter that operates for a third duration (t3) corresponding to a fixed part of a negative portion of the SSC cycle;
    a second random generator that operates for a fourth duration (t4) corresponding to a variable part of the negative portion of the SSC cycle;
    a set of configurable registers that store parameters to control operations of the first and second counters and the first and second random generators; and
    a state machine that sequentially triggers the first and second counters and the first and second random generators in a specified order to generate the SSC cycle,
    wherein, for a set of parameters stored in the registers:
        the first duration is fixed from cycle to cycle of the SSC signal;
        the third duration is fixed from cycle to cycle of the SSC signal; and
        the second and fourth durations vary from cycle to cycle of the SSC signal.

9. A spread-spectrum clock (SSC) generator for generating an SSC signal, the SSC generator comprising:
    a first counter that operates for a first duration (t1) corresponding to a fixed part of a positive portion of an SSC cycle of the SSC signal;
    a first random generator that operates for a second duration (t2) corresponding to a variable part of the positive portion of the SSC cycle;
    a second counter that operates for a third duration (t3) corresponding to a fixed part of a negative portion of the SSC cycle;
    a second random generator that operates for a fourth duration (t4) corresponding to a variable part of the negative portion of the SSC cycle;
    a set of configurable registers that store parameters to control operations of the first and second counters and the first and second random generators; and
a state machine that sequentially triggers the first and second counters and the first and second random generators in a specified order to generate the SSC cycle,
    wherein each counter and each random generator are configurable to be independently selected or disabled.

* * * * *